United States Patent
Paital et al.

(10) Patent No.: US 11,929,212 B2
(45) Date of Patent: Mar. 12, 2024

(54) METHOD TO FORM HIGH CAPACITANCE THIN FILM CAPACITORS (TFCS) AS EMBEDDED PASSIVES IN ORGANIC SUBSTRATE PACKAGES

(71) Applicant: Intel Corporation, Santa Clara, CA (US)

(72) Inventors: Sameer Paital, Chandler, AZ (US); Gang Duan, Chandler, AZ (US); Srinivas Pietambaram, Chandler, AZ (US); Kristof Darmawikarta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1007 days.

(21) Appl. No.: 16/392,028

(22) Filed: Apr. 23, 2019

(65) Prior Publication Data
US 2020/0343049 A1    Oct. 29, 2020

(51) Int. Cl.
| | |
|---|---|
| H01G 4/33 | (2006.01) |
| H01G 4/224 | (2006.01) |
| H01G 4/30 | (2006.01) |
| H01G 4/38 | (2006.01) |
| H01L 23/00 | (2006.01) |
| H01L 23/498 | (2006.01) |
| H01L 23/538 | (2006.01) |
| H01G 4/12 | (2006.01) |

(52) U.S. Cl.
CPC .............. *H01G 4/33* (2013.01); *H01G 4/224* (2013.01); *H01G 4/306* (2013.01); *H01G 4/38* (2013.01); *H01L 23/49838* (2013.01); *H01L 23/5385* (2013.01); *H01L 24/16* (2013.01); *H01G 4/1227* (2013.01); *H01L 2224/16227* (2013.01)

(58) Field of Classification Search
None
See application file for complete search history.

(56) References Cited

U.S. PATENT DOCUMENTS

| | | | |
|---|---|---|---|
| 2006/0130303 A1* | 6/2006 | Yamasaki | H05K 1/162 257/E23.079 |
| 2007/0094871 A1* | 5/2007 | Moon | H01G 4/10 29/25.42 |
| 2007/0113663 A1* | 5/2007 | Crockett | F15C 5/00 73/718 |
| 2008/0307620 A1* | 12/2008 | Lee | H05K 1/162 29/25.03 |
| 2017/0229795 A1* | 8/2017 | Kim | H01R 43/007 |
| 2020/0258832 A1* | 8/2020 | Matsumoto | H01L 23/49537 |
| 2020/0266003 A1* | 8/2020 | Asahi | H01G 2/065 |

* cited by examiner

*Primary Examiner* — Hsien Ming Lee
(74) *Attorney, Agent, or Firm* — Schwabe, Williamson & Wyatt, P.C.

(57) ABSTRACT

Embodiments disclosed herein include an electronic package and methods of forming an electronic package. In an embodiment, the electronic package comprises a package substrate, an organic layer over the package substrate, and a capacitor embedded in the organic layer. In an embodiment, the capacitor comprises, a first electrode, where the first electrode comprises a seam between a first conductive layer and a second conductive layer, a dielectric layer over the first electrode, and a second electrode over the dielectric layer.

19 Claims, 14 Drawing Sheets

METHOD TO FORM HIGH CAPACITANCE THIN FILM CAPACITORS (TFCS) AS EMBEDDED PASSIVES IN ORGANIC SUBSTRATE PACKAGES

TECHNICAL FIELD

Embodiments of the present disclosure relate to electronic packaging, and more particularly, to electronic packages with high capacitance thin film capacitors (TFCs) that include fully crystalline ceramic oxide based dielectrics embedded in an organic substrate.

BACKGROUND

Capacitors are the most commonly used passive component in an electronic package and outnumber active components and other passives such as inductors and resistors. Hence, capacitors, when implemented as surface mount discrete (SMD) components, occupy a larger board space and is a major barrier for miniaturization and performance efficiency of electronic systems. Embedded capacitors as an integral passive in an electronic package is thus gaining importance. Also, when a decoupling capacitor with a higher capacitance is placed directly below the die shadow of the component that is being served by the capacitor, the switching performance can be increased. This leads to improved microprocessor speeds.

An embedded capacitor, requires higher capacitance density (e.g., greater than 10 nF/mm$^2$), as they are limited by the capacitor area. Only certain ceramic oxides (e.g., $BaTiO_3$, $SrTiO_3$, etc.) and other ferroelectric ceramic based dielectric thin films can provide such high capacitance densities. However, such dielectrics require high temperature processing (e.g., in excess of 600° C.) in order to provide the desired crystal structures that enable such a high capacitance density. These high temperature processing conditions are higher than what is allowable in organic packaging environments. As such, it is currently not possible to embed such high performance dielectrics in organic substrate packages without additional complex processing.

For example, one existing solution is to utilize vertically aligned sandwich capacitors that are unit structures and which are placed into a cavity with a pick and place tool. The use of this technique adds to additional process steps and capital, such as cavity creation by laser process for capacitor placement, desmear process for cavity clean, and precise pick and place equipment with sophisticated vision system for fiducial alignment and panel compensation (e.g., scaling, rotation, shift, skew etc.) calculation for accurate placement of preformed capacitors inside the cavity. In addition, the preformed capacitors would require special adhesive films to attach the capacitor. These films are prone to foreign material contamination and compromise the reliability and efficiency (i.e., lower capacitance) of the capacitor within the substrate.

Other manufacturing approaches for embedded capacitor include thin film based deposition techniques to form the ceramic dielectric layer between the top and bottom metal electrodes and as a 3D sandwich structure within stacked vias or build up layers of the substrate packages. The as deposited ceramic based thin films are primarily amorphous in nature and needs curing (e.g., at 600° C. or greater) to make it crystalline and achieve the required capacitance. Since such high temperature processing of organic substrate packages (e.g. at temperatures above approximately 250° C.) results in thermal degradation, sophisticated processing tools such as laser or plasma to achieve localized annealing of dielectric film is needed. However, annealing with laser and plasma can result in film damage and discontinuity which further can deteriorate the capacitance.

EMBODIMENTS OF THE PRESENT DISCLOSURE

Figure 1A:
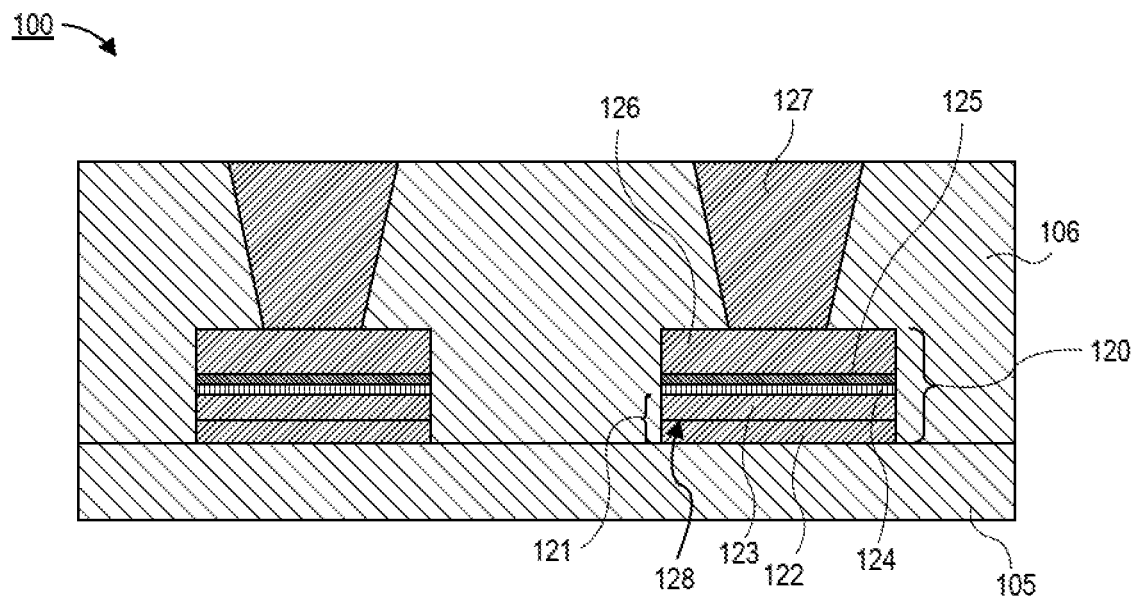
FIG. 1A is a cross-sectional illustration of an electronic package with embedded thin film capacitors (TFCs), in accordance with an embodiment.

Described herein are electronic packages with high capacitance thin film capacitors (TFCs) embedded in organic layers and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, high performance dielectrics with capacitance densities of approximately 10 nF/mm2 or greater are not currently able to be embedded in organic package substrates without special processing (e.g., picking and placing of prefabricated capacitors, or selective laser or plasma annealing of the dielectric). Accordingly, there is not a currently available a cost effective process compatible with high volume manufacturing that enables the embedding of high performance dielectrics in organic package substrates.

As such, embodiments disclosed herein include thin film capacitors (TFCs) that are embeddable in organic package substrates using low temperature processes. Particularly, the dielectric layer and a portion of the first electrode are processed separately in order to cure the dielectric and provide a highly crystalline structure that provides the desired high capacitance density (e.g., approximately 10 nF/mm2 or greater). After curing, the portion of the first electrode is bonded (using a diffusion bonding process) to a second portion of the first electrode. The diffusion bonding process may be implemented at low temperatures (e.g., 250° C. or lower), and therefore, does not negatively impact the organic layers of the electronic package. In such embodiments, the first electrode may be characteristically defined by a seam that serves as an indicator that a diffusion bonding process was used to form the first electrode.

Such embodiments provide a reduction in overall system (PCB) mass and foot print by eliminating surface mount technology (SMT) process. Additionally, improved electrical performance is obtained by eliminating lead contacts and parasitics present in SMD components. Furthermore, embodiments provide increased design flexibility and improved thermo-mechanical reliability by eliminating solder joints. The flexibility of the process associated with the diffusion bonding process disclosed herein allows for the capacitor structure to be fabricated directly below the active components as an interposer or patch. This in turn can reduce the current path and package inductance and improve power delivery performance. In case of multi-chip module (MCM) packages, capacitors in accordance with embodiments disclosed herein may be used as a decoupling capacitor to minimize the on chip noise or simultaneous switching noise by being directly placed close to the chip, thereby minimizing the interconnect distance.

Referring now to FIG. 1A, a cross-sectional illustration of an electronic package 100 is shown, in accordance with an embodiment. In an embodiment, the electronic package 100 comprises a substrate 105. The substrate 105 may comprise an organic substrate. For example, the substrate 105 may comprise one or more organic laminated layers with conductive routing (e.g., traces, vias, etc.). In some embodiments, the substrate 105 may comprise a core or the substrate 105 may be a coreless substrate. The substrate 105 may comprise one or more passive or active components embedded within the organic layers.

In an embodiment, a thin film capacitor (TFC) 120 may be positioned over the substrate 105. The TFC 120 (also referred to herein as simply a "capacitor") may comprise a first electrode 121, a dielectric layer 125 and a second electrode 126. The first electrode 121, the dielectric layer 125 and the second electrode 126 may be oriented in a vertical stack. That is, the first electrode 121 may be at the bottom of the stack, the dielectric layer 125 may be over the first electrode 121, and the second electrode 126 may be over the dielectric layer 125.

In an embodiment, the first electrode 121 may comprise a first conductive layer 123 and a second conductive layer 122. That is, the first electrode 121 may comprise conductive regions that have a discernable boundary. For example, a seam 128 may serve as a boundary between the first conductive layer 123 and the second conductive layer 122. The seam 128 may have the characteristics of a diffusion bonded interface. In such embodiments, the first conductive layer 123 may comprise substantially the same material composition as the second conductive layer 122. Particularly, the seam may be the result of spontaneous adhesion of hydrophilic surfaces of the first conductive layer 123 and the second conductive layer 122 followed by diffusion across the bonding interfaces (i.e., also known as grain boundary diffusion). In embodiments, where the first conductive layer 123 and the second conductive layer 122 comprise copper, the diffusing species may be copper atoms.

Figure 1B:
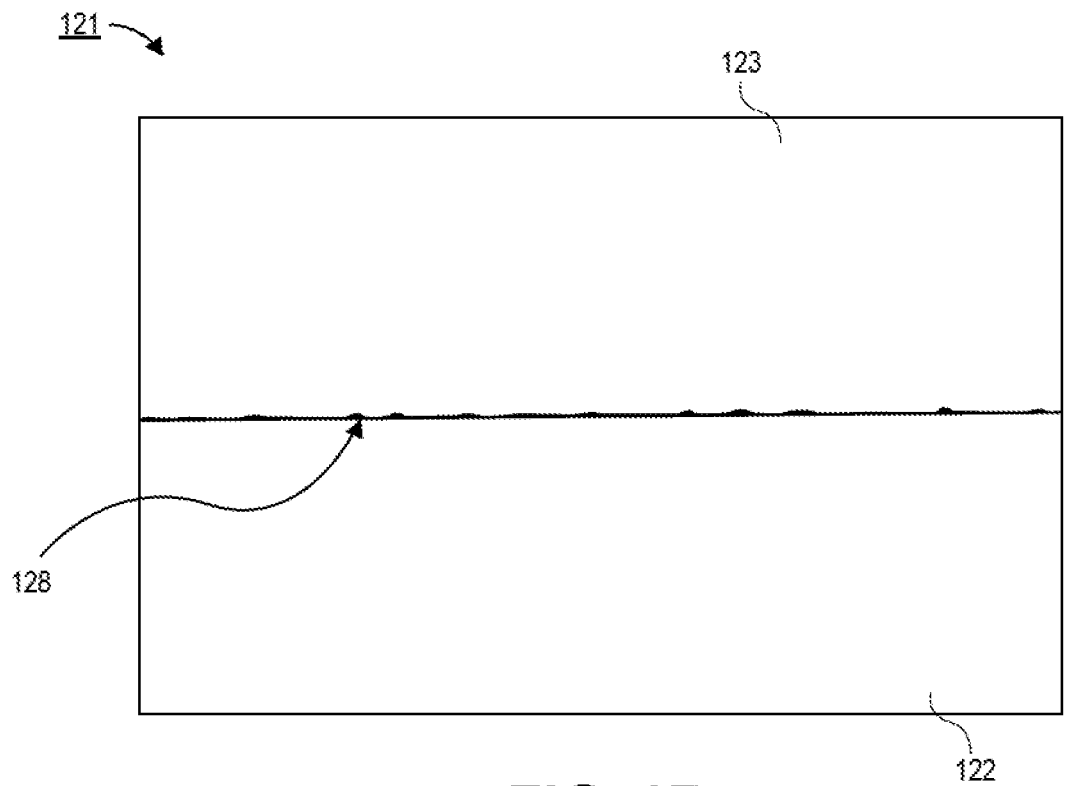
FIG. 1B is a cross-sectional illustration of a first electrode of the TFC that comprises a seam between a bottom portion of the first electrode and a top portion of the first electrode, in accordance with an embodiment.

Referring now to FIG. 1B, a cross-sectional illustration of an exemplary first electrode 121 is shown in accordance with an embodiment. As shown, the first conductive layer 123 interfaces with the second conductive layer 122 at a seam 128. The seam 128 is clearly distinguishable in the cross-section. For example, the seam 128 may comprise a substantially linear boundary between the two conductive layers 123, 122. While substantially linear, those skilled in the art will recognize that the seam 128 may comprise minor variations in thickness across a length of the seam 128. Furthermore, variations in the seam may result from surface irregularities in the bonding surfaces of the first conductive layer 123 and the second conductive layer 122. That is, when the first conductive layer 123 and the second conductive layer 122 have substantially planar surfaces with relatively low surface roughness, the seam 128 will have a more uniform shape than a seam 128 formed when the bonding surfaces have a higher surface roughness and/or are not substantially planar. Those skilled in the art will recognize that diffusion bonding will generate a seam 128 that is perceptible in cross-sectional micrographs of the interface. As such, while an example of a seam 128 is provided in FIG. 1B, it is to be appreciated that embodiments are not limited to seams 128 that match the general illustration shown herein. Embodiments include any seam 128 that is characteristic of diffusion bonding.

Referring back to FIG. 1A, the capacitor 120 may further comprise a barrier layer 124 between the first electrode 121 and the dielectric layer 125. Particularly, the barrier layer 124 may be positioned between the first conductive layer 123 and the dielectric layer 125. The barrier layer 124 may be used to minimize diffusion between the first conductive layer 123 and the dielectric layer 125. As will be disclosed in greater detail below, the top surface of the dielectric layer 125 may not be susceptible to diffusion. Therefore, in some embodiments, there may not need to be a barrier layer 124 between the dielectric layer 125 and the second electrode 126. In an embodiment, the barrier layer 124 may comprise nickel. For example, the barrier layer 124 may comprise nickel, nickel oxide, or any other suitable material for minimizing diffusion. In an embodiment, the barrier layer 124 may have a thickness that is less than approximately 1,000 nm. For example, the barrier layer 124 may have a thickness between approximately 500 nm and 1,000 nm.

In an embodiment, the dielectric layer 125 may be a dielectric material with a high capacitance density. For example, the capacitance density of the dielectric layer 125 may be approximately 10 nF/mm2 or greater. Such high capacitance densities are provided by highly crystalline ceramics. In a particular embodiment, the dielectric layer 125 may comprise a ceramic oxide. For example, the ceramic oxide may comprise oxygen, titanium, and one or both of barium and strontium (e.g., $BaTiO_3$, $SrTiO_3$, etc.). In other embodiments, the dielectric layer 125 may comprise any ferroelectric ceramic. In an embodiment, the dielectric layer 125 may be a thin film. For example, a thickness of the dielectric layer 125 may be less than 600 nm (e.g., between approximately 400 nm and 600 nm).

As noted above, the use of such dielectric materials has previously been problematic in electronic packaging applications due to the need of high temperature curing (e.g., 600° C. or greater) needed to provide the desired crystalline structure that enables the high capacitance density. Accordingly, embodiments disclosed herein include a process where the high temperature curing process is implemented before integration with organic packaging layers. Particularly, and as will be described in greater detail below, an amorphous dielectric layer 125 is disposed over the first conductive layer 123, cured to form a highly crystalline dielectric layer 125, and then the first conductive layer 123 is bonded to the second conductive layer 122 with a diffusion bonding process that is implemented at relatively low temperatures suitable for the organic materials (e.g., 250° C. or less).

In an embodiment, the capacitor 120 may be embedded in an organic layer 106. The organic layer 106 may be the same material as the organic materials of the substrate 105. In the illustrated embodiment, the organic layer 106 is illustrated as being the topmost layer of the electronic package 100. However, it is to be appreciated that the capacitor 120 may be embedded in any layer of the electronic package 100 (e.g., embedded in the substrate 105). In an embodiment, a via 127 may extend through the organic layer 106 to provide an electrical connection to the second electrode 126. In FIG. 1A, a pair of capacitors 120 are shown for simplicity. However, it is to be appreciated that any number of embedded capacitors 120 may be included in the electronic package 100 (e.g., one or more capacitors 120, tens of capacitors 120, hundreds of capacitors 120, etc.).

Figure 2A:
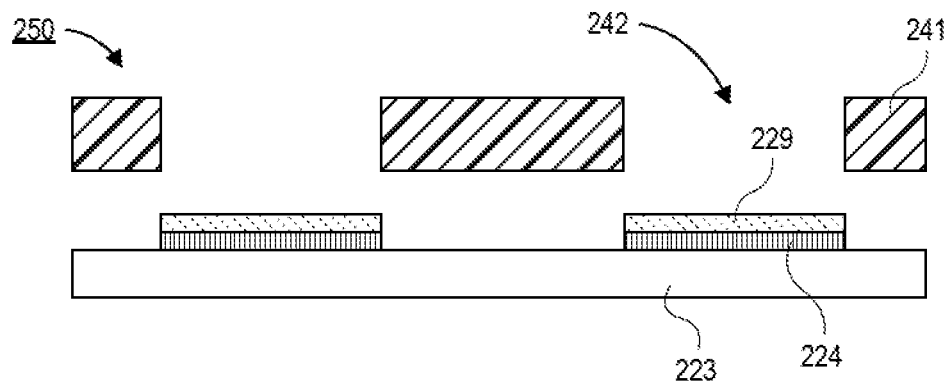
FIG. 2A is a cross-sectional illustration of a dielectric layer disposed over a first conductive layer through a shadow mask, in accordance with an embodiment.
Figure 2B:
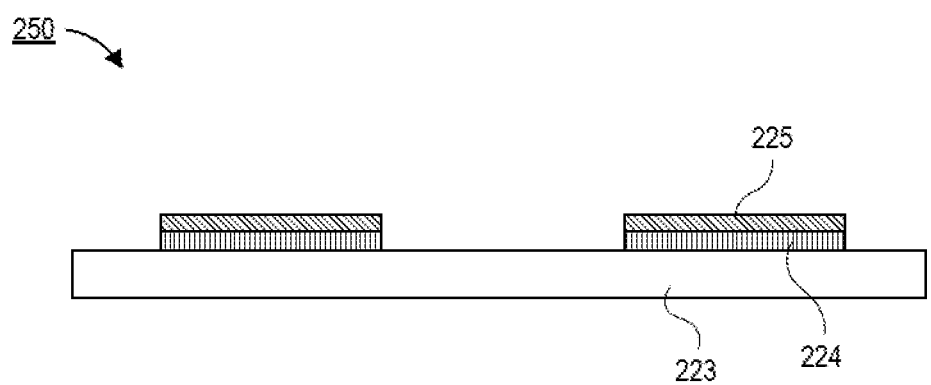
FIG. 2B is a cross-sectional illustration of the dielectric layer after curing, in accordance with an embodiment.

Referring now to FIG. 2A-2B, cross-sectional illustrations depicting a process of forming a capacitor sheet 250 comprising highly crystalline dielectric layers 225 on a first conductive layer 223 are shown, in accordance with an embodiment.

Referring now to FIG. 2A, a cross-sectional illustration of the capacitor sheet 250 after an amorphous dielectric layer 229 is disposed over the first conductive layer 223 is shown, in accordance with an embodiment. In an embodiment, the first conductive layer 223 may be a foil (e.g., a copper foil). The first conductive layer 223 may be a panel level foil, a wafer level foil, or any other suitable dimension. In an embodiment, the amorphous dielectric layer 229 may be separated from the first conductive layer 223 by a barrier layer 224. In an embodiment, the barrier layer 224 and the amorphous dielectric layer 229 may be disposed on the first conductive layer 223 with a deposition process using a shadow mask 241 with openings 242 to selectively deposit the layers in locations over the first conductive layer 223 where capacitors are desired. In an embodiment, any thin film deposition process may be used to deposit the amorphous dielectric layer 229 and the barrier layer 224 (e.g., physical vapor deposition (PVD), chemical vapor deposition (CVD), pulsed laser deposition, sputtering, etc.).

Referring now to FIG. 2B, a cross-sectional illustration after the amorphous dielectric layer 229 is cured to form a highly crystalline dielectric layer 225 (referred to herein as simply a "dielectric layer" for brevity) is shown, in accordance with an embodiment. In an embodiment, the curing process may include a relatively high temperature cure (e.g., 600° C. or greater) in order to provide the desired crystal structure. Since there are no organic materials present on the capacitor sheet 250, there is no issue with degradation of the electronic package as the result of the curing of the dielectric layer 225.

As noted above, the presence of the barrier layer 224 protects against diffusion between the dielectric layer 225 and the first conductive layer 223. Accordingly, a pristine dielectric layer 225 (i.e., a dielectric layer 225 with minimal impurities) is provided. This enables the highest capacitance density possible. In some embodiments, the barrier layer 224 may also serve as a sacrificial oxidizing target. That is, when the barrier layer 224 has a higher affinity for oxygen than the first conductive layer 223, the barrier layer 224 will preferentially oxidize and prevent the first conductive layer 223 from oxidizing. Such sacrificial oxidation allows for improved bonding in subsequent processing operations, as will be described in greater detail below. For example, when the first conductive layer 223 is copper, the barrier layer 224 may comprise nickel. Accordingly, in some embodiments, the barrier layer 224 may comprise nickel and oxygen (e.g., NiO).

Referring now to FIGS. 3A-3D, a series of cross-sectional illustrations depicting a process for forming a capacitor sheet 350 is shown, in accordance with an additional embodiment.

Figure 3A:
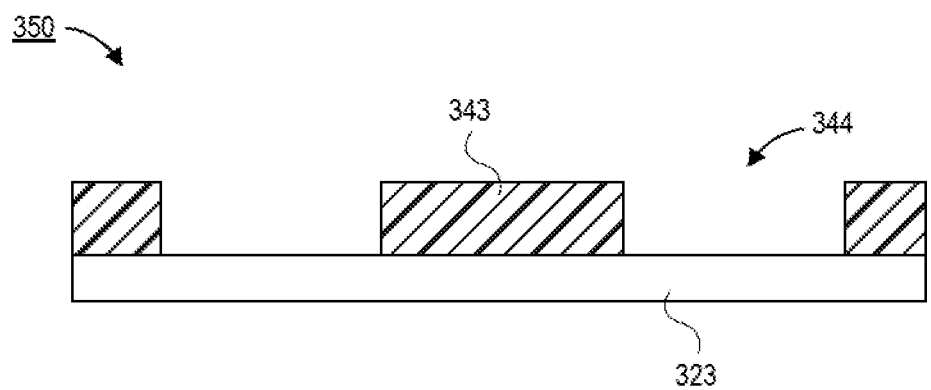
FIG. 3A is a cross-sectional illustration of a patterned resist over a first conductive layer, in accordance with an embodiment.

Referring now to FIG. 3A, a cross-sectional illustration of a capacitor sheet 350 comprising a first conductive layer 323 and a patterned resist 343 is shown, in accordance with an embodiment. In an embodiment, the first conductive layer 323 may be a foil (e.g., a copper foil). The first conductive layer 323 may be a panel level foil, a wafer level foil, or any other suitable dimension. The patterned resist 343 may be a dry film resist (DFR) or the like. Openings 344 may be formed through the resist 343 to expose portions of the first conductive layer 323 where capacitors are desired to be formed.

Figure 3B:
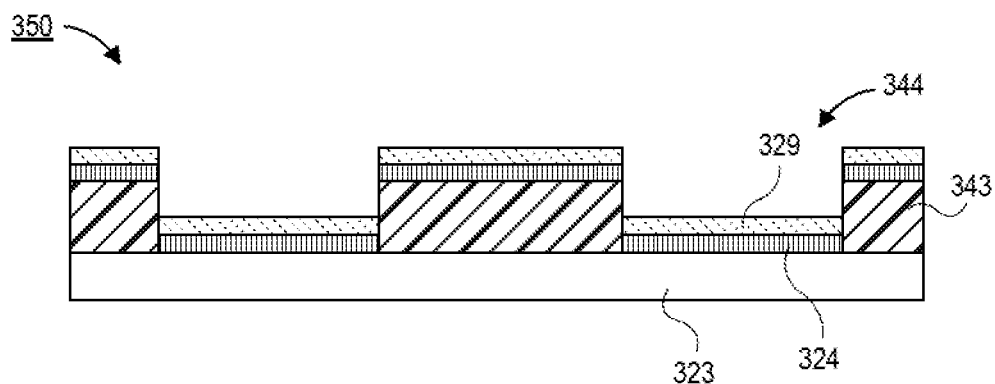
FIG. 3B is a cross-sectional illustration after a dielectric layer is disposed on the first conductive layer through the patterned resist, in accordance with an embodiment.

Referring now to FIG. 3B, a cross-sectional illustration of the capacitor sheet 350 after a barrier layer 324 and an amorphous dielectric layer 329 is disposed over the first conductive layer 323 is shown, in accordance with an embodiment. The barrier layer 324 and the amorphous dielectric layer 329 may be substantially similar to the barrier layer 224 and amorphous dielectric layer 229 described above.

Figure 3C:
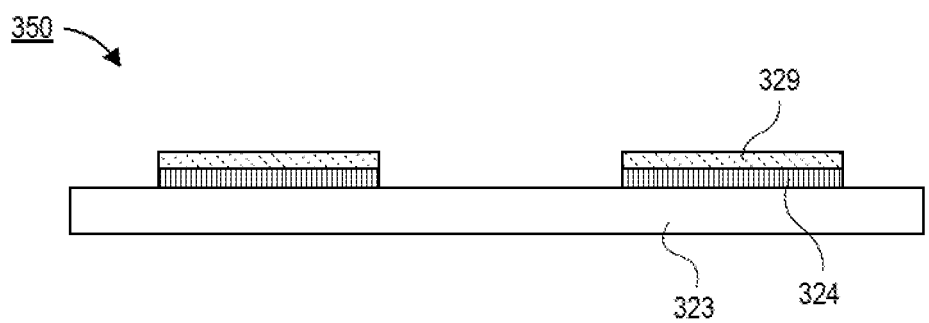
FIG. 3C is a cross-sectional illustration after the patterned resist is removed, in accordance with an embodiment.
Figure 3D:
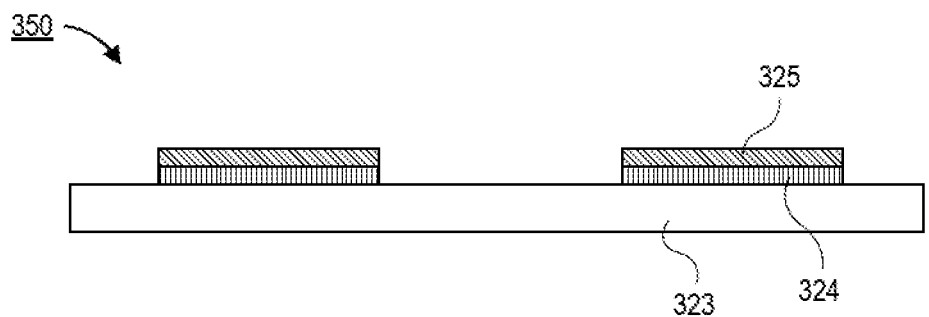
FIG. 3D is a cross-sectional illustration after the dielectric layer is cured, in accordance with an embodiment.

Referring now to FIG. 3C, a cross-sectional illustration of the capacitor sheet 350 after the resist layer 343 is removed is shown, in accordance with an embodiment. After removal of the resist layer 343, the capacitor sheet 350 may be cured in order to convert the amorphous dielectric layer 329 to a crystalline dielectric layer 325, as shown in FIG. 3D. The curing process may be substantially similar to the curing process described above with respect to FIG. 2B.

Referring now to FIGS. 4A-4K, a series of cross-sectional illustrations depict a process for integrating a capacitor sheet 450 into an electronic package 400 to provide embedded TFCs.

Figure 4A:
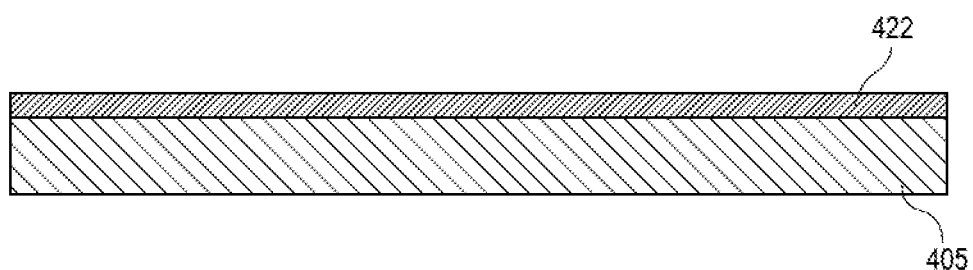
FIG. 4A is a cross-sectional illustration of an electronic package with a second conductive layer over a package substrate, in accordance with an embodiment.

Referring now to FIG. 4A, a cross-sectional illustration of an electronic package 400 is shown, in accordance with an embodiment. In an embodiment, the electronic package 400 may comprise a substrate 405 and a second conductive layer 422 over the substrate 405. The substrate 405 may be substantially similar to the substrate 105 described above. That is, the substrate 405 may comprise one or more organic layers with conductive features (e.g., traces, vias, etc.), passive components, active components, or the like embedded in the organic layers.

Figure 4B:
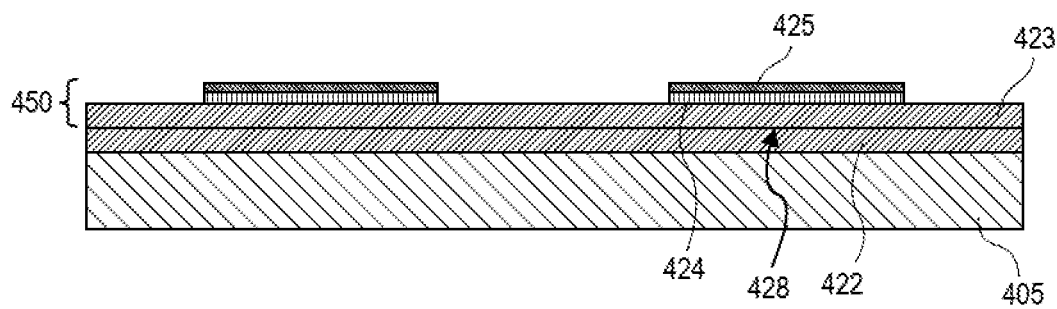
FIG. 4B is a cross-sectional illustration of the electronic package after the first conductive layer comprising the cured dielectric layer is bonded to the second conductive layer, in accordance with an embodiment.

Referring now to FIG. 4B, a cross-sectional illustration of the electronic package 400 after a capacitor sheet 450 is bonded to the second conductive layer 422 is shown, in accordance with an embodiment. Particularly, embodiments include a diffusion bonding process between the first conductive layer 423 and the second conductive layer 422. The diffusion bonding process may provide a discernable seam 428 between the first conductive layer 423 and the second conductive layer 422. For example, the seam 428 may be substantially similar to the seam 128 described above with respect to FIGS. 1A and 1B.

In an embodiment, the diffusion bonding process may be proceeded by a surface preparation process that provides pristine surfaces on the first conductive layer 423 and the second conductive layer 422 to improve the bonding at the interface. Diffusion bonding is a surface phenomenon and surface properties (e.g., micro roughness, undulation, cleanliness (e.g., foreign material or oxides), etc.) can modulate the atomic diffusion behavior at the interface, thereby impacting the interfacial strength and electrical behavior. Accordingly, the surfaces of the first conductive layer 423 and the second conductive layer 422 may be prepared to minimize undulation, control roughness, and cleaned to remove any oxide or foreign materials. For example, a chemical mechanical polishing (CMP) process may be implemented to control the undulation and roughness to the submicron scale. A wet (chemical) and/or dry (plasma) process may be used to clear the surfaces of any oxides or foreign materials.

Once the surfaces of the first conductive layer 423 and the second conductive layer 422 are prepared, the capacitor sheet 450 may be aligned (e.g., with fiducial marks or the like) and clamped together. The diffusion bonding may be implemented in a furnace (e.g., a vacuum furnace) at temperatures less than 250° C. (e.g., approximately 150° C.) for a period of time (e.g., between several minutes and an hour). As noted above, the mechanism of the diffusion bonding is the spontaneous adhesion of hydrophilic surfaces followed by atomic diffusion across the bonding interfaces, also known as grain boundary diffusion. In some embodiments, the stack up may be annealed to remove any residual stress and promote grain growth to improve both the interfacial strength and electrical conductivity. For example, the anneal temperature may be approximately 200° C. and last for between several minutes and an hour.

Figure 4C:
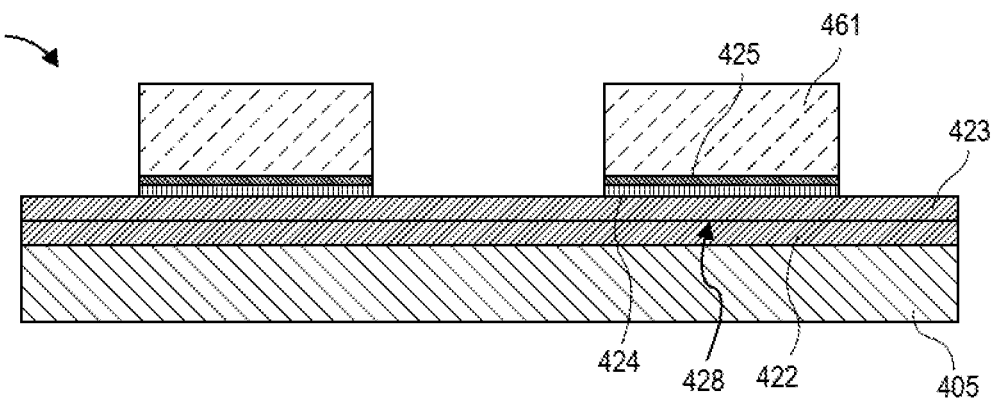
FIG. 4C is a cross-sectional illustration after a resist is disposed over the dielectric layer, in accordance with an embodiment.

Referring now to FIG. 4C, a cross-sectional illustration after a resist layer 461 (e.g., a DFR) is disposed over the electronic package 400 and patterned is shown, in accordance with an embodiment. In an embodiment, the remaining portions of the resist layer 461 may be positioned over the dielectric layer 425. That is, the resist layer 461 may cover the portions of the electronic package 400 where a capacitor is desired.

Figure 4D:
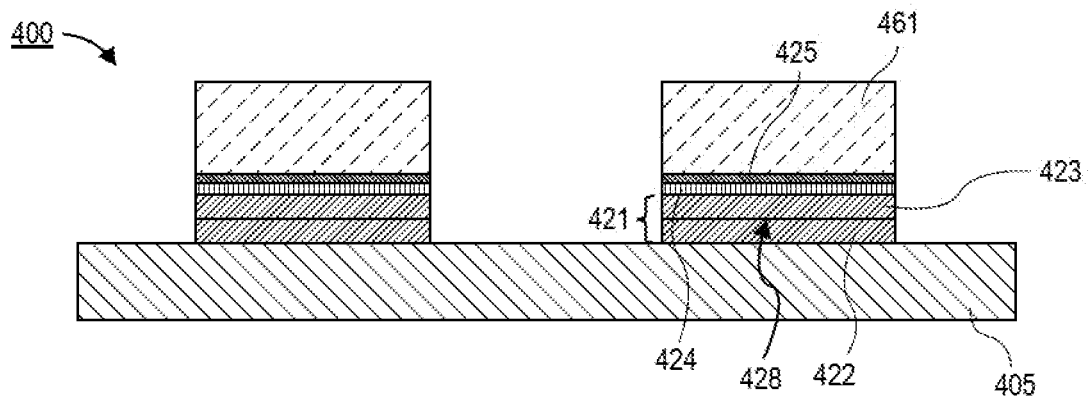
FIG. 4D is a cross-sectional illustration after the first conductive layer and the second conductive layer are patterned to form a first electrode, in accordance with an embodiment.

Referring now to FIG. 4D, a cross-sectional illustration after the first conductive layer 423 and the second conductive layer 422 are patterned is shown, in accordance with an embodiment. In an embodiment, the etching process defines the first electrode 421 of the capacitor. That is, the first conductive layer 423 and the second conductive layer 422 are patterned so that only portions of the first conductive layer 423 and the second conductive layer 422 below the dielectric layer 425 remain. Accordingly, the first electrode 421 comprise a first conductive layer 423 and a second conductive layer 422 with a discernable seam 428 between the first conductive layer 423 and the second conductive layer 422.

Figure 4E:
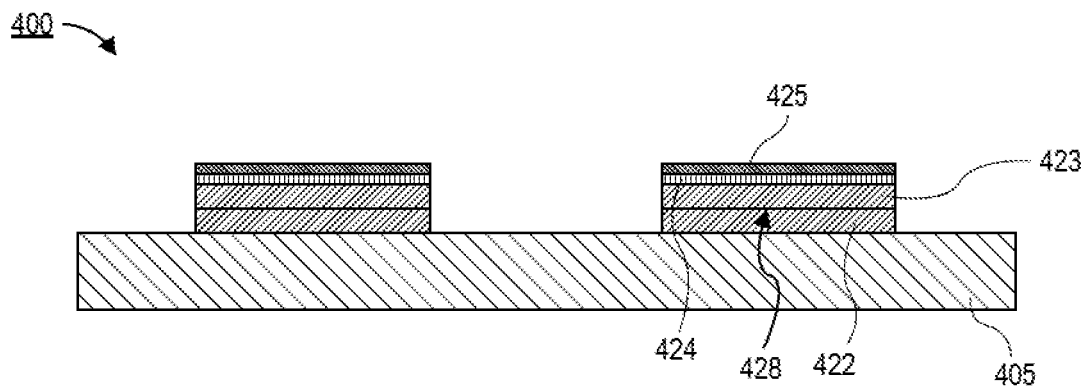
FIG. 4E is a cross-sectional illustration after the resist layer is removed, in accordance with an embodiment.

Referring now to FIG. 4E, a cross-sectional illustration after the resist layer 461 is removed is shown, in accordance with an embodiment. Removal of the resist layer 461 exposes a top surface of the dielectric layer 425. While a resist layer 461 is used in FIGS. 4C-4D, it is to be appreciated that in some embodiments, the dielectric layer 425 may function as a mask to enable the patterning of the first conductive layer 423 and the second conductive layer 422.

Figure 4F:
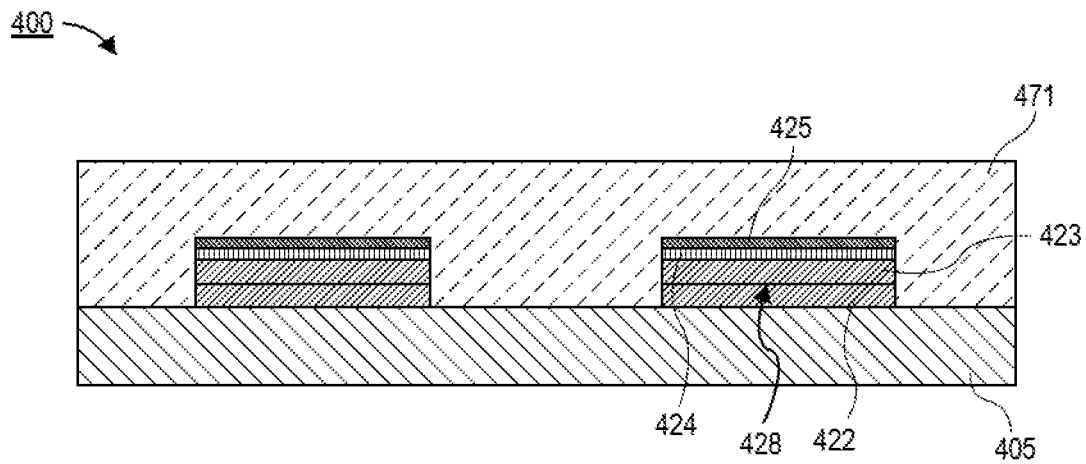
FIG. 4F is a cross-sectional illustration after a second resist layer is disposed over the electronic package, in accordance with an embodiment.

Referring now to FIG. 4F, a cross-sectional illustration after a second resist layer 471 is disposed over the electronic package 400 is shown, in accordance with an embodiment. In an embodiment, the second resist layer 471 embeds the partially formed capacitor.

Figures 4G, 4H, 4I:
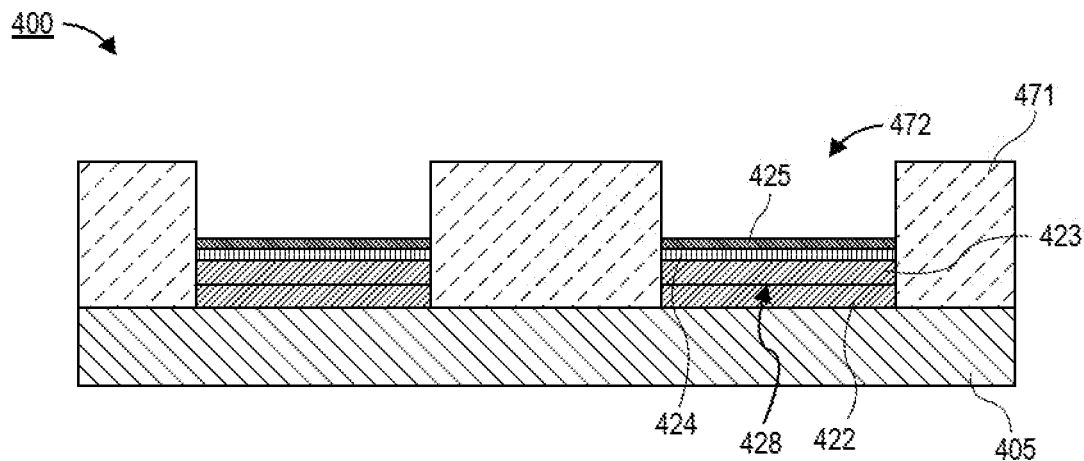
FIG. 4G is a cross-sectional illustration after openings through the second resist layer are formed to expose the dielectric layer, in accordance with an embodiment.
FIG. 4H is a cross-sectional illustration after a second electrode is disposed over the dielectric layer, in accordance with an embodiment.
FIG. 4I is a cross-sectional illustration after the second resist layer is removed, in accordance with an embodiment.

Referring now to FIG. 4G, a cross-sectional illustration after openings 472 are formed into the second resist layer 471 is shown, in accordance with an embodiment. In an embodiment, the openings 472 may expose the top surface of the dielectric layer 425.

Referring now to FIG. 4H, a cross-sectional illustration after a second electrode 426 is disposed over the dielectric layer 425 is shown, in accordance with an embodiment. In an embodiment, the second electrode 426 may be deposited with any suitable process. For example, a seed layer may be sputtered and the bulk of the second electrode 426 may be plated with an electrolytic plating process. As illustrated, the second electrode 426 may be disposed directly over the dielectric layer 425. This may be done without diffusion concerns since there is no subsequent high temperature processing that would drive unwanted diffusion between the second electrode 426 and the dielectric layer 425. However, in some embodiments, a barrier layer (not shown) may be provided between the second electrode 426 and the dielectric layer 425.

Referring now to FIG. 4I, a cross-sectional illustration after the second resist layer 471 is removed is shown, in accordance with an embodiment. At this point, the entire capacitor 420 (i.e., the first electrode 421, the barrier layer 424, the dielectric layer 425, and the second electrode 426) are completed and integrated onto a substrate 405 that comprises organic materials.

Figure 4J:
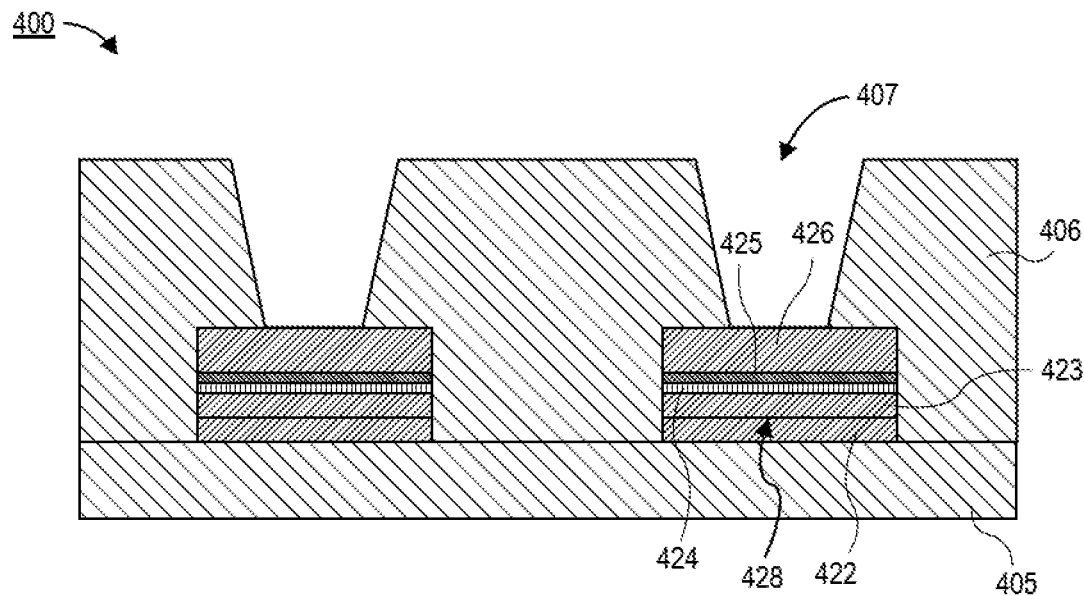
FIG. 4J is a cross-sectional illustration after an organic layer is disposed over the capacitor comprising the first electrode, the dielectric layer, and the second electrode and via openings to expose the second electrode are formed through the organic layer, in accordance with an embodiment.
Figure 4K:
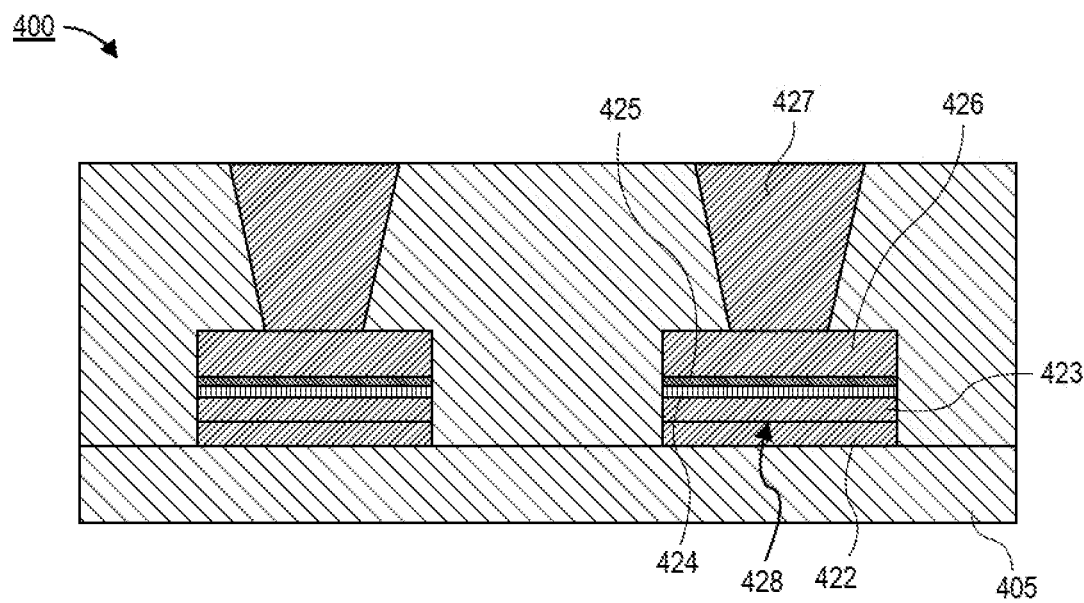
FIG. 4K is a cross-sectional illustration after vias are disposed in the via openings, in accordance with an embodiment.

Referring now to FIGS. 4J and 4K, cross-sectional illustrations depicting additional processing operations (e.g., typical semi-additive process (SAP) operations) to complete the fabrication of package 400 are shown, in accordance with an embodiment. For example, FIG. 4J illustrates the lamination of an organic layer 406 over the electronic package 400 followed by patterning to form via openings 407. The via openings 407 are filled with conductive material such as copper or silver 427 in FIG. 4K using standard processes.

Referring now to FIGS. 5A-5K, a series of cross-sectional illustrations depicting a process for integrating a capacitor sheet 550 into an electronic package 500 to provide embedded TFCs is shown, in accordance with an additional embodiment.

Figure 5A:
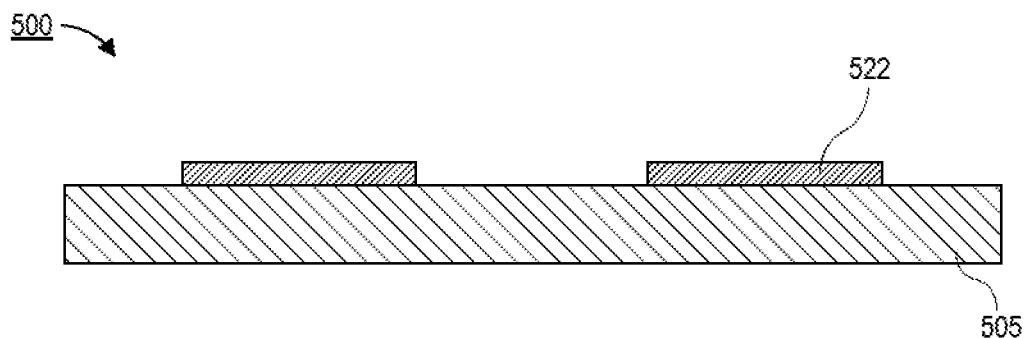
FIG. 5A is a cross-sectional illustration of an electronic package with a patterned second conductive layer over a package substrate, in accordance with an embodiment.

Referring now to FIG. 5A, a cross-sectional illustration of an electronic package 500 that comprises a substrate 505 and a second conductive layer 522 over the substrate 505 is shown, in accordance with an embodiment. In an embodiment, the substrate 505 may be substantially similar to the substrate 105 described above. That is, the substrate 505 may comprise one or more organic layers with conductive features (e.g., traces, vias, etc.), passive components, active components, or the like embedded in the organic layers. In an embodiment, the package 500 in FIG. 5A differs from the package 400 in FIG. 4A in that the second conductive layer 522 is a patterned layer. The second conductive layer 522 is only present at locations where a capacitor is desired.

Figure 5B:
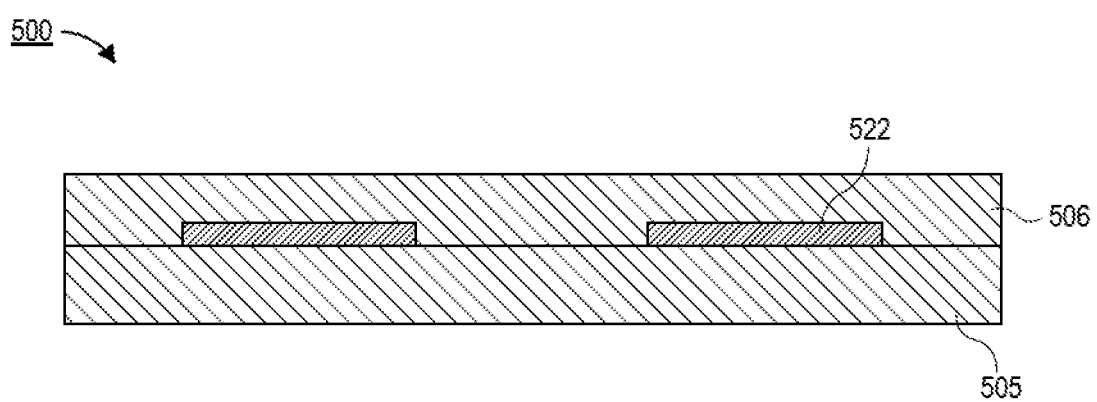
FIG. 5B is a cross-sectional illustration after an organic layer is disposed over the second conductive layer, in accordance with an embodiment.

Referring now to FIG. 5B, a cross-sectional illustration after an organic layer 506 is disposed over the electronic package 500 is shown, in accordance with an embodiment. In an embodiment, the organic layer 506 may be laminated over the electronic package 500, as is known in the art.

Figure 5C:
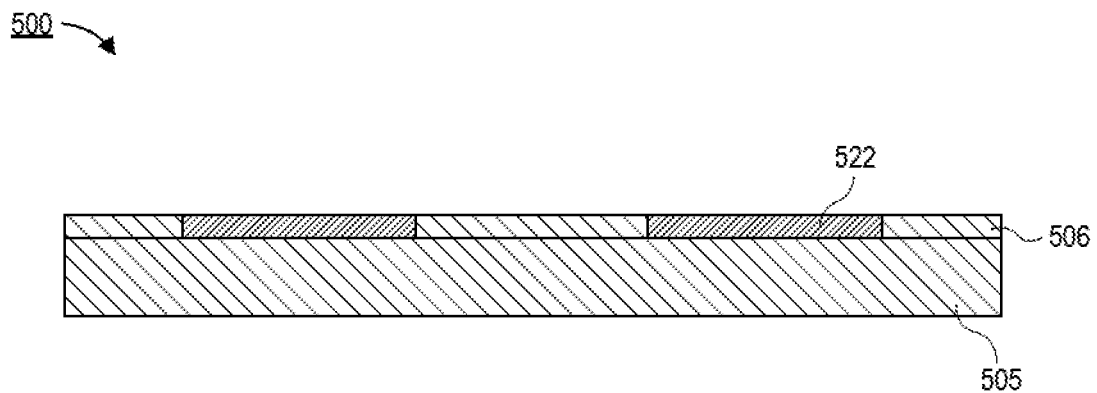
FIG. 5C is a cross-sectional illustration after the organic layer is planarized with a top surface of the second conductive layer, in accordance with an embodiment.

Referring now to FIG. 5C, a cross-sectional illustration after the organic layer 506 is planarized is shown, in accordance with an embodiment. In an embodiment, the organic layer 506 may be planarized such that a top surface of the organic layer 506 is substantially coplanar with a top surface of the second conductive layer 522.

Figure 5D:
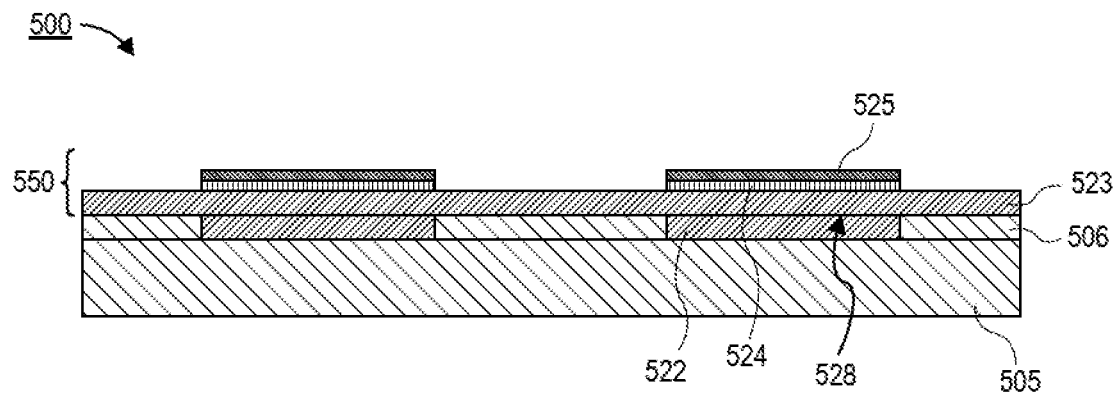
FIG. 5D is a cross-sectional illustration after the first conductive layer comprising the dielectric layer is bonded to the second conductive layer and the organic layer, in accordance with an embodiment.

Referring now to FIG. 5D, a cross-sectional illustration after a capacitor sheet 550 comprising a first conductive layer 523, a barrier layer 524, and a dielectric layer 525 is bonded to the package substrate 500 is shown, in accordance with an embodiment. Particularly, the first conductive layer 523 may be bonded with a hybrid diffusion bonding process. That is, the first conductive layer 523 is bonded to both the organic layer 506 and the second conductive layer 522. In an embodiment, the bonding process (including surface preparation and alignment) may be substantially similar to the bonding process described above with respect to FIG. 4B.

Figure 5E:
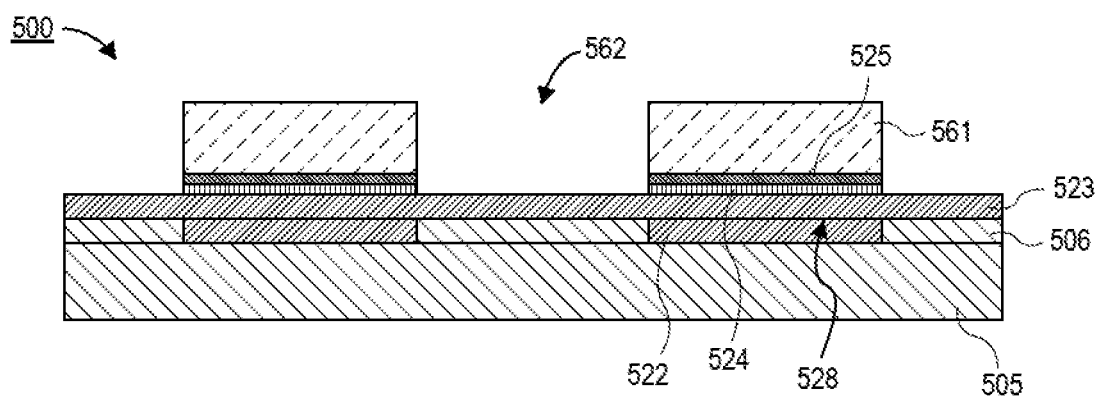
FIG. 5E is a cross-sectional illustration after a resist layer is disposed over the dielectric layer, in accordance with an embodiment.

Referring now to FIG. 5E, a cross-sectional illustration after a resist layer 561 is disposed over the electronic package 500 and patterned is shown, in accordance with an embodiment. In an embodiment, the resist layer 561 may be patterned to form openings 562. The remaining portions of the resist layer 561 may be positioned above the dielectric layer 525.

Figure 5F:
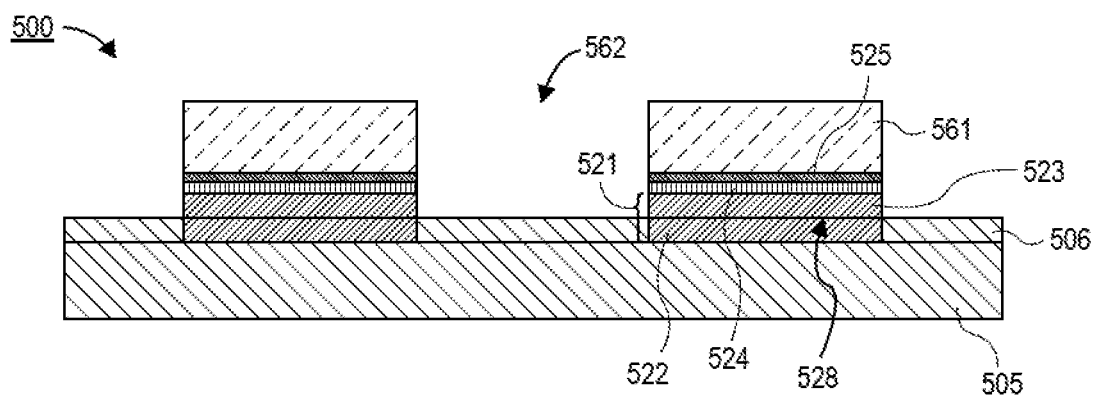
FIG. 5F is a cross-sectional illustration after the first conductive layer is patterned to form a first electrode, in accordance with an embodiment.

Referring now to FIG. 5F, a cross-sectional illustration after the first conductive layer 523 is patterned is shown, in accordance with an embodiment. In an embodiment, the patterning of the first conductive layer 523 defines the first electrode 521. That is, the first conductive layer 523 and the second conductive layer 522 is patterned so that only portions of the first conductive layer 523 and the second conductive layer 522 below the dielectric layer 525 remain. Accordingly, the first electrode 521 comprise a first conductive layer 523 and a second conductive layer 522 with a discernable seam 528 between the first conductive layer 523 and the second conductive layer 522.

Figure 5G:
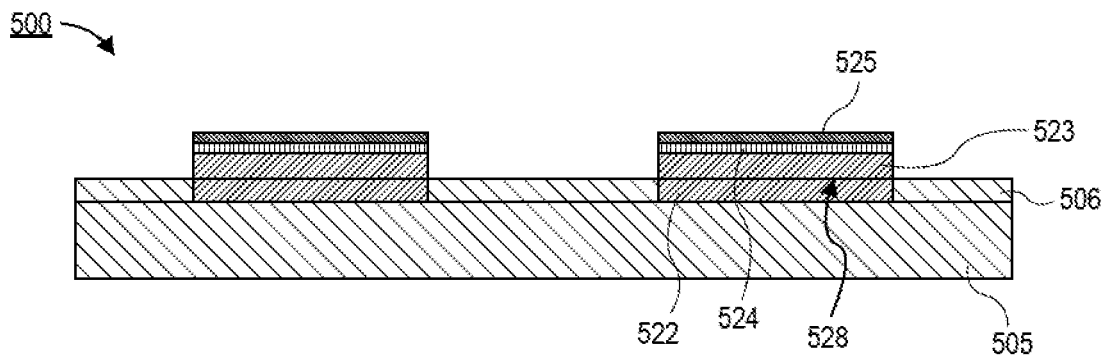
FIG. 5G is a cross-sectional illustration after the resist layer is removed, in accordance with an embodiment.

Referring now to FIG. 5G, a cross-sectional illustration after the resist layer 561 is removed is shown, in accordance with an embodiment. Removal of the resist layer 561 exposes a top surface of the dielectric layer 525. While a resist layer 561 is used in FIGS. 5E-5F, it is to be appreciated that in some embodiments, the dielectric layer 525 may function as a mask to enable the patterning of the first conductive layer 523.

Figure 5H:
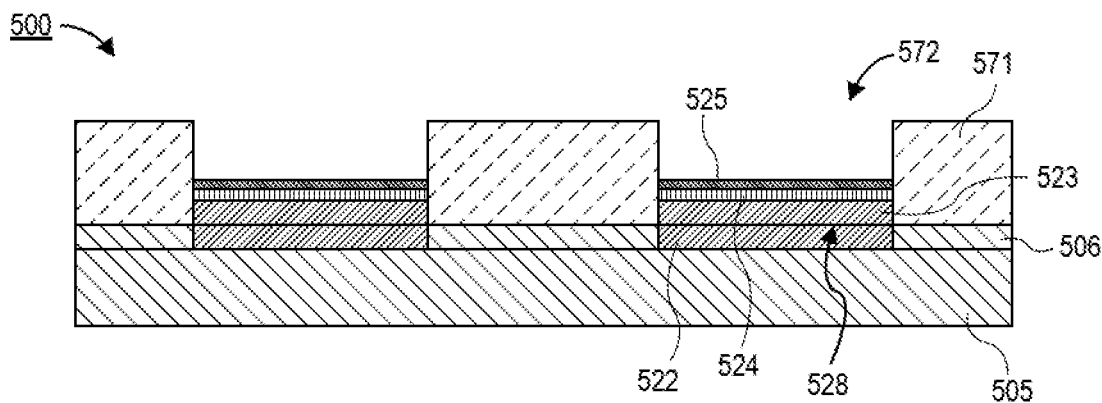
FIG. 5H is a cross-sectional illustration after a second resist layer is disposed and patterned to expose the dielectric layer, in accordance with an embodiment.

Referring now to FIG. 5H, a cross-sectional illustration after a second resist layer 571 is disposed over the electronic package 500 and patterned is shown, in accordance with an embodiment. In an embodiment, the second resist layer 571 embeds the partially formed capacitor. The patterning may form openings 572 into the second resist layer 571. In an embodiment, the openings 572 may expose the top surface of the dielectric layer 525.

Figure 5I:
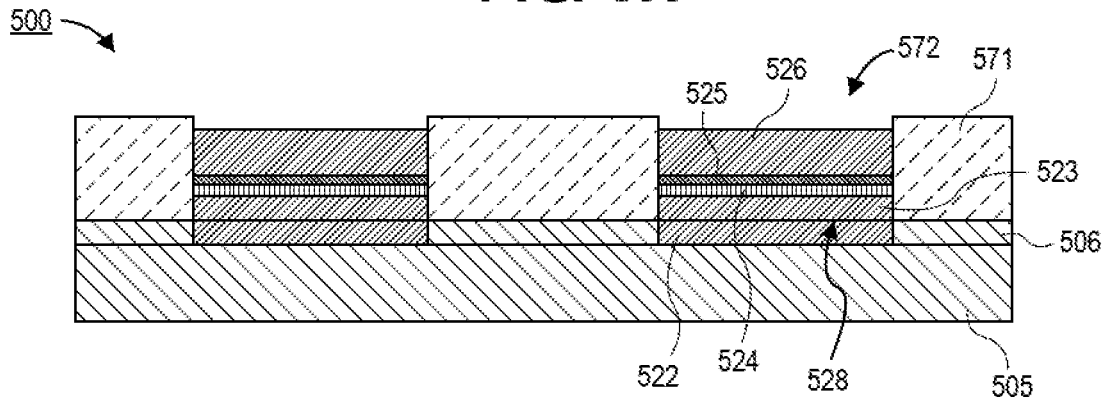
FIG. 5I is a cross-sectional illustration after a second electrode is disposed over the dielectric layer, in accordance with an embodiment.

Referring now to FIG. 5I, a cross-sectional illustration after a second electrode 526 is disposed over the dielectric layer 525 is shown, in accordance with an embodiment. In an embodiment, the second electrode 526 may be deposited with any suitable process. For example, a seed layer may be sputtered and the bulk of the second electrode 526 may be plated with an electrolytic plating process. As illustrated, the second electrode 526 may be disposed directly over the dielectric layer 525. This may be done without diffusion concerns since there is no subsequent high temperature processing that would drive unwanted diffusion between the second electrode 526 and the dielectric layer 525. However, in some embodiments, a barrier layer (not shown) may be provided between the second electrode 526 and the dielectric layer 525.

Figure 5J:
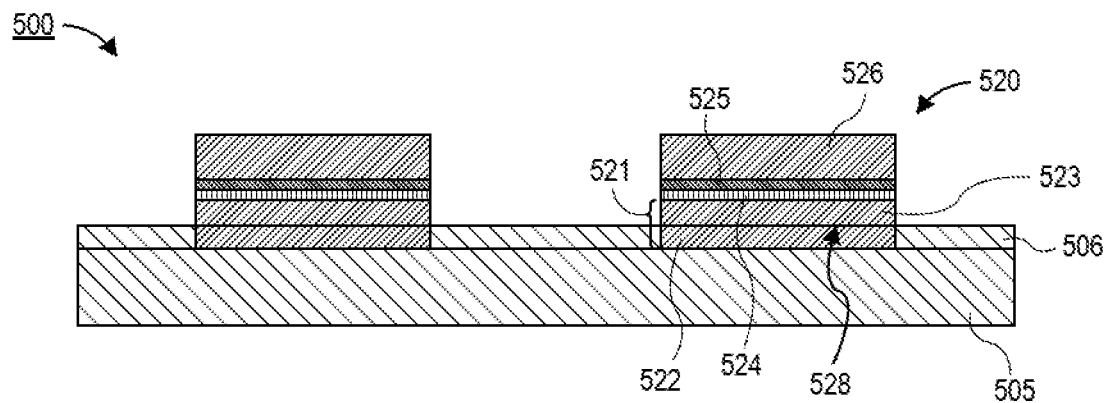
FIG. 5J is a cross-sectional illustration after the second resist layer is removed, in accordance with an embodiment.

Referring now to FIG. 5J, a cross-sectional illustration after the second resist layer 571 is removed is shown, in accordance with an embodiment. At this point, the entire capacitor 520 (i.e., the first electrode 521, the barrier layer 524, the dielectric layer 525, and the second electrode 526) are completed and integrated onto a substrate 505 that comprises organic materials.

Figure 5K:
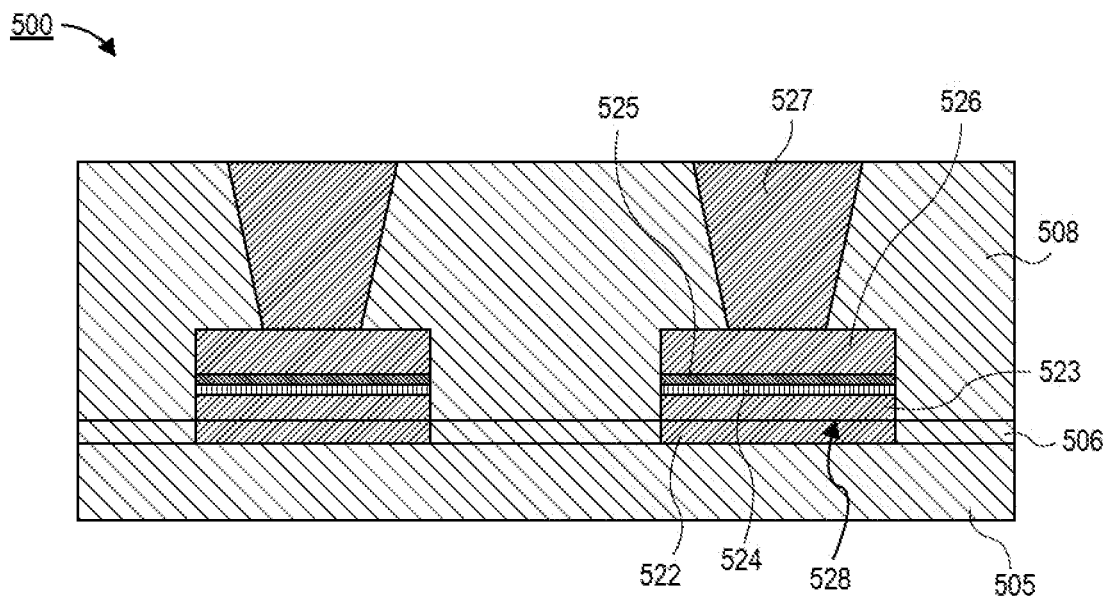
FIG. 5K is a cross-sectional illustration after an organic layer is disposed over the capacitor comprising the first electrode, the dielectric layer, and the second electrode, and a via is formed to the second electrode, in accordance with an embodiment.

Referring now to FIG. 5K, a cross-sectional illustration after additional processing operations (e.g., typical semi-additive process (SAP) operations) used to complete the fabrication of package 500 is shown, in accordance with an embodiment. For example, an organic layer 508 may be laminated over the electronic package 500 followed by patterning to form via openings that are filled with conductive materials such as copper or silver 527.

Figure 6A:
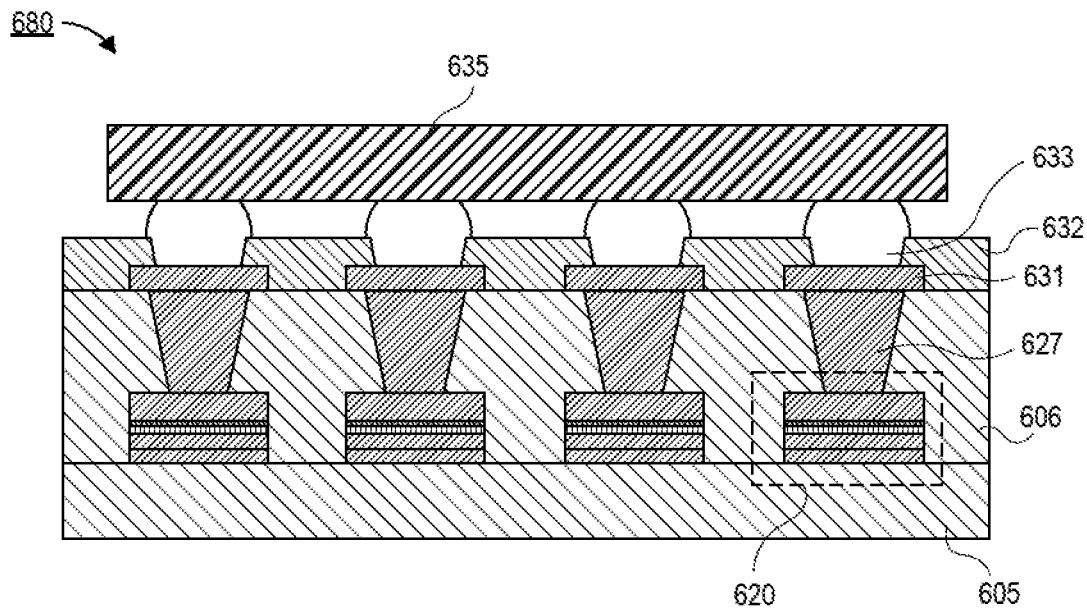
FIG. 6A is a cross-sectional illustration of an electronic system with a die electrically coupled to a package substrate that comprises embedded thin film capacitors (TFCs), in accordance with an embodiment.
Figure 6B:
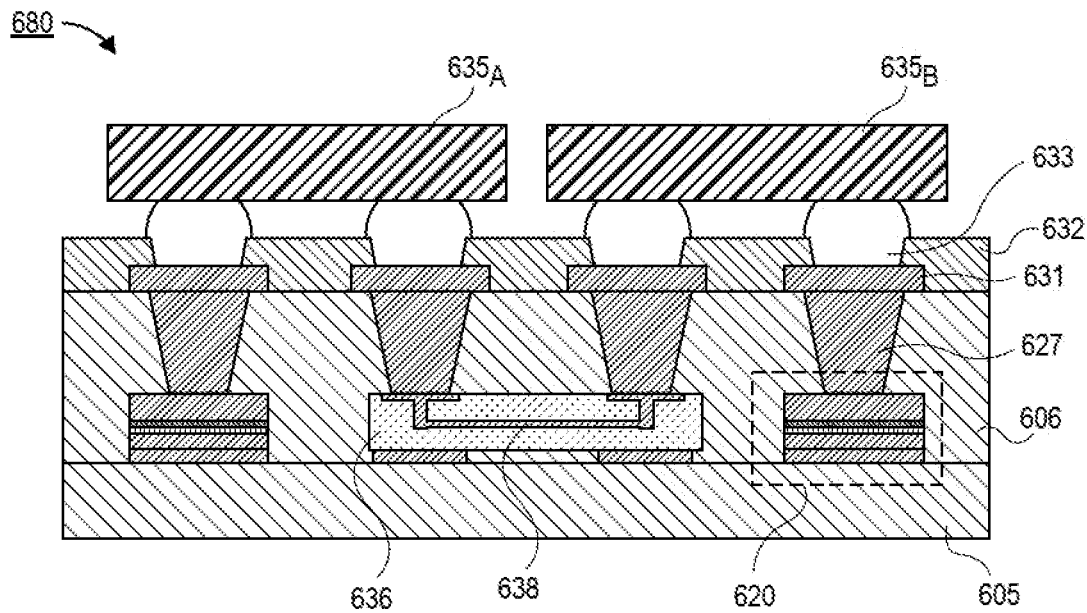
FIG. 6B is a cross-sectional illustration of an electronic system with a plurality of dies electrically coupled to a package substrate that comprises embedded TFCs, in accordance with an embodiment.
Figure 6C:
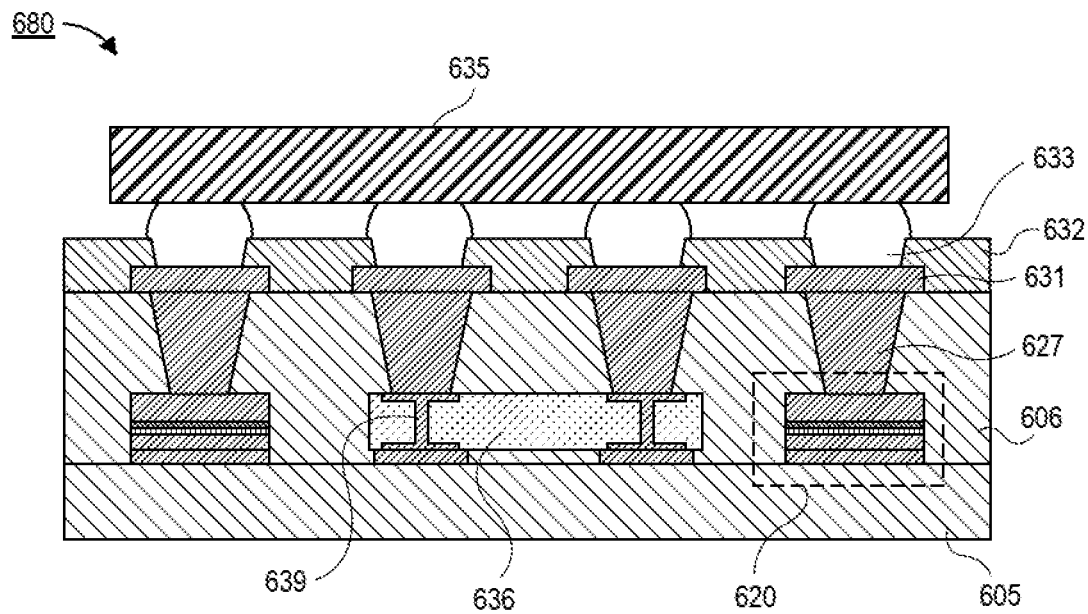
FIG. 6C is a cross-sectional illustration of an electronic system with a plurality of dies electrically coupled to a package substrate that comprises embedded TFCs, in accordance with an additional embodiment.

Referring now to FIGS. 6A-6C, a series of cross-sectional illustrations depict electronic systems 680 that include electronic packages with embedded TFCs 620, in accordance with various embodiments.

Referring now to FIG. 6A, a cross-sectional illustration of an electronic system 680 that includes a monolithic die 635 attached to the electronic package is shown, in accordance with an embodiment. The electronic package may comprise a substrate 605 (e.g., one or more organic build up layers) and a plurality of capacitors 620 embedded in an organic layer 606. In an embodiment, the capacitors 620 may be substantially similar to the capacitors described above. In an embodiment, the capacitors 620 may be electrically coupled to the die 635 with vias 627, via pads 631, and interconnects 633. The interconnects (e.g., first level interconnects (FLIs)) may pass through a solder resist 632 or the like.

In an embodiment, the capacitors 620 may be decoupling capacitors. For example, the capacitors 620 may be positioned within a die shadow of the die 635. The flexibility to position the capacitors 620 at any location allows for improved switching performance and, thereby, microprocessor speed can be increased.

Referring now to FIG. 6B, a cross-sectional illustration of an electronic system 680 with an embedded multi die interconnect bridge (EMIB) architecture that includes embedded TFCs is shown, in accordance with an embodiment. In an embodiment, electronic system 680 in FIG. 6B differs from the electronic system 680 in FIG. 6A in that a first die 635A and a second die 635B are coupled together by high density traces 638 in a bridge 636. In an embodiment, the plurality of capacitors 620 may be integrated into the same organic layer 606 as the bridge 636.

Referring now to FIG. 6C, a cross-sectional illustration of an electronic system 680 that comprises a 3D packaging architecture is shown, in accordance with an embodiment. In an embodiment, the bridge 636 may comprise through silicon vias 639 for providing high density routing to the die 635.

While FIGS. 6A-6C illustrate several exemplary architectures that may utilize embedded TFCs such as those described herein. However, it is to be appreciated that any architecture may benefit from high performance TFCs such as those disclosed herein, and the inclusion of TFCs in an electronic system is not limited to the specific architectures disclosed herein.

Figure 7:
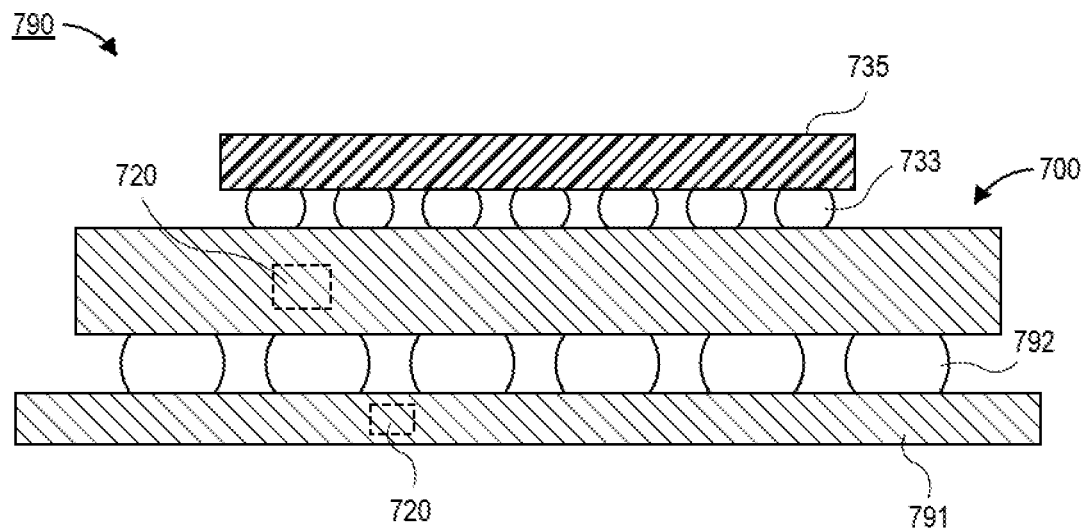
FIG. 7 is a cross-sectional illustration of an electronic system that comprises an electronic package with an embedded TFC, in accordance with an embodiment.

Referring now to FIG. 7, a cross-sectional illustration of a system 790 is shown, in accordance with an embodiment. In an embodiment, the system 790 may comprise a board 791 (e.g., a motherboard, a printed circuit board (PCB), or the like) and an electronic package 700 attached to the board 791 by interconnects 792. The electronic package 700 may be electrically coupled to the board 791 with any suitable interconnect (e.g., solder balls, pins, wire bonds, or the like). In an embodiment, one or more dies 735 may be electrically coupled to the electronic package 700 by interconnects 733 (e.g., FLIs such as copper pillars, bumps, solder balls, or the like).

In an embodiment, the electronic package 700 may comprise organic layers (e.g., build up layers). Conductive structures (not show) such as vias, traces, and the like may be embedded in the electronic package 700. Other components, (e.g., passives, actives, bridges, etc.) may also be embedded in the electronic package 700. In a particular embodiment, one or more capacitors 720, such as those described herein, may be embedded in the electronic package 700. The capacitors 720 may be positioned in any layer of the electronic package 700, and positioned at any location in the X-Y plane. For example, one or more of the capacitors 720 may be located within a shadow of the one or more dies 735. In some embodiments, the board 791 may also comprise one or more capacitors 720, such as those described herein.

Figure 8:
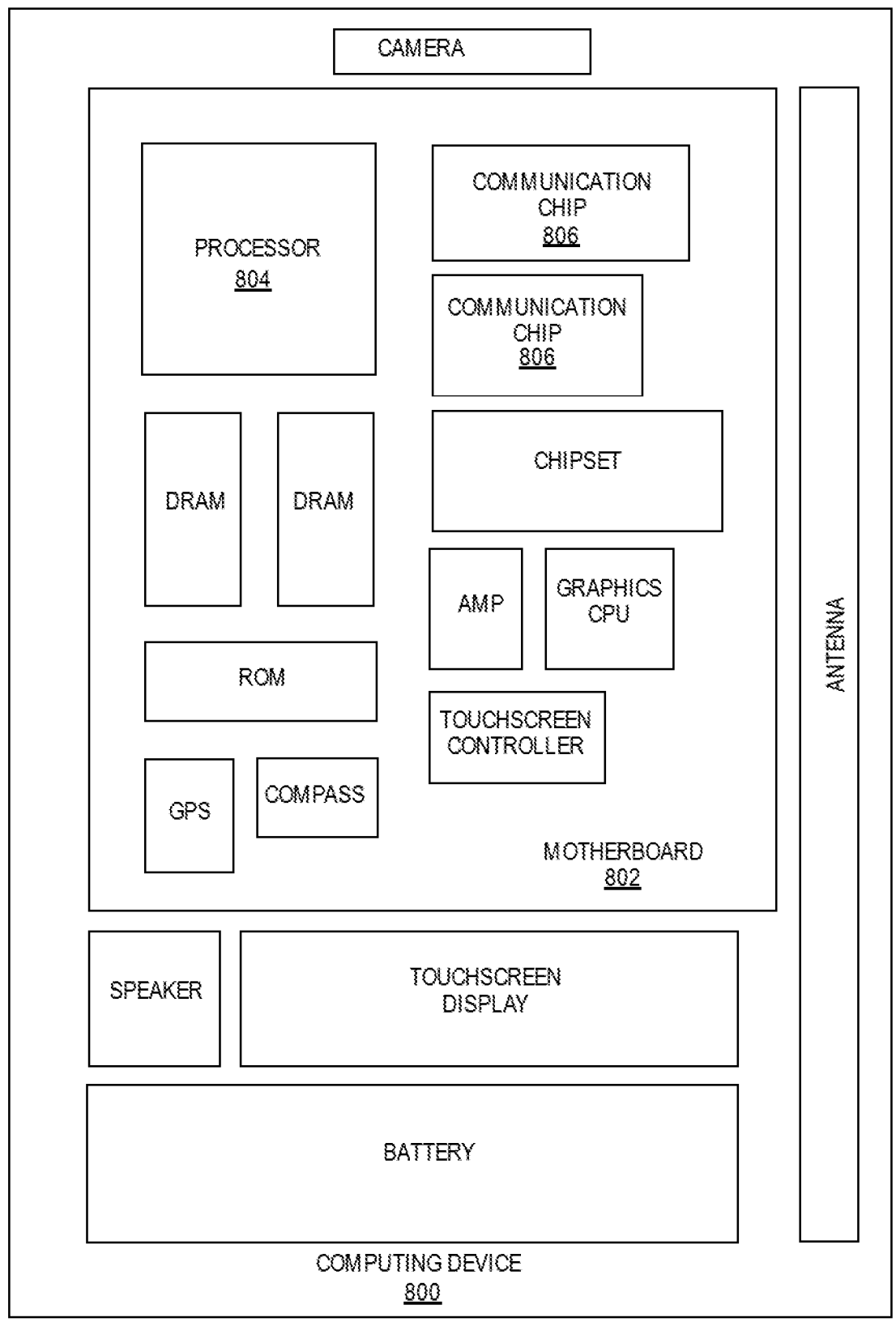
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be packaged in an electronic system that comprises a TFC with a high capacitance density embedded in an organic layer, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be packaged in an electronic system that comprises a TFC with a high capacitance density embedded in an organic layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; an organic layer over the package substrate; and a capacitor embedded in the organic layer, wherein the capacitor comprises: a first electrode, wherein the first electrode comprises a seam between a first conductive layer and a second conductive layer; a dielectric layer over the first electrode; and a second electrode over the dielectric layer.

Example 2: the electronic package of Example 1, wherein the seam is characteristic of diffusion bonding between the first conductive layer and the second conductive layer.

Example 3: the electronic package of Example 1 or Example 2, wherein the dielectric layer is a ceramic material.

Example 4: the electronic package of Example 3, wherein the ceramic material comprises a crystalline microstructure.

Example 5: the electronic package of Example 3, wherein the ceramic material comprises a ceramic oxide.

Example 6: the electronic package of Example 5, wherein the ceramic oxide comprises titanium, oxygen, and one or both of barium and strontium.

Example 7: the electronic package of Example 3, wherein the ceramic material comprises a ferroelectric ceramic.

Example 8: the electronic package of Examples 1-7, wherein the dielectric layer has a capacitance density of 10 nF/mm2 or greater.

Example 9: the electronic package of Examples 1-8, wherein a thickness of the dielectric layer is between 200 nm and 800 nm.

Example 10: the electronic package of Examples 1-9, further comprising: a barrier layer between the dielectric layer and the first electrode.

Example 11: the electronic package of Example 10, wherein the barrier layer comprises nickel.

Example 12: the electronic package of Example 10 or Example 11, wherein the barrier layer has a thickness between 500 nm and 1,000 nm.

Example 13: the electronic package of Examples 10-12, wherein the second electrode directly contacts the dielectric layer.

Example 14: the electronic system, comprising: a board; an electronic package over the board, wherein the electronic package comprises an embedded capacitor, wherein the embedded capacitor comprises: a first electrode having a seam at a location between a top surface of the first electrode and a bottom surface of the first electrode; a dielectric layer over the first electrode; and a second electrode over the dielectric layer; and a die electrically coupled to the electronic package.

Example 15: the electronic system of Example 14, wherein the embedded capacitor is within a footprint of the die.

Example 16: the electronic system of Example 14 or Example 15, wherein the embedded capacitor is embedded in a topmost layer of the electronic package.

Example 17: the electronic system of Examples 14-15, further comprising a plurality of dies electrically coupled to the electronic package.

Example 18: the electronic system of Example 17, wherein the plurality of dies are electrically coupled to each other by a bridge embedded in the electronic package.

Example 19: the electronic system of Example 18, wherein the embedded capacitor and the bridge are in the same layer of the electronic package.

Example 20: a method of forming an electronic package with an embedded thin film capacitor, comprising: disposing a dielectric layer over a first conductive layer, wherein the dielectric layer comprises a ceramic oxide; curing the dielectric layer at a first temperature, wherein curing dielectric layer provides a crystalline microstructure to the dielectric layer; bonding the first conductive layer to a second conductive layer that is adhered to a package substrate, wherein the bonding comprises a diffusion bonding process at a second temperature that is less than the first temperature; and disposing a third conductive layer over the cured dielectric layer.

Example 21: the method of Example 20, wherein the first temperature is approximately 600° C. or greater, and wherein the second temperature is approximately 250° C. or less.

Example 22: the method of Example 20 or Example 21, further comprising: disposing a barrier layer between the dielectric layer and the first conductive layer.

Example 23: the method of Example 22, wherein the barrier layer comprises nickel, and wherein the barrier layer is oxidized during the curing of the dielectric layer.

Example 24: the method of Examples 20-23, wherein the first conductive layer is only bonded to the second conductive layer.

Example 25: the method of Examples 20-23, wherein the first conductive layer is bonded to the second conductive layer and a surface of an organic layer that is substantially coplanar with a surface of the second conductive layer.

What is claimed is:

1. An electronic package, comprising:
    a package substrate;
    an organic layer over the package substrate; and
    a capacitor embedded in the organic layer, wherein the capacitor comprises:
        a first electrode, wherein the first electrode comprises a seam between a first conductive layer and a second conductive layer, wherein the seam is a boundary between a hydrophilic surface of the first conductive layer and a hydrophilic surface of the second conductive layer, the seam having variations in thickness across a length of the seam from surface irregularities in the hydrophilic surface of the first conductive layer and the hydrophilic surface of the second conductive layer;
        a dielectric layer over the first electrode; and
        a second electrode over the dielectric layer.

2. The electronic package of claim 1, wherein the seam is characteristic of diffusion bonding between the first conductive layer and the second conductive layer.

3. The electronic package of claim 1, wherein the dielectric layer is a ceramic material.

4. The electronic package of claim 3, wherein the ceramic material comprises a crystalline microstructure.

5. The electronic package of claim 3, wherein the ceramic material comprises a ceramic oxide.

6. The electronic package of claim 5, herein the ceramic oxide comprises titanium, oxygen, and one or both of barium and strontium.

7. The electronic package of claim 3, wherein the ceramic material comprises a ferroelectric ceramic.

8. The electronic package of claim 1, wherein the dielectric layer has a capacitance density of 10 nF/mm$^2$.

9. The electronic package of claim 1, wherein a thickness of the dielectric layer is between 200 nm and 800 nm.

10. The electronic package of claim 1, further comprising:
    a barrier layer between the dielectric layer and the first electrode.

11. The electronic package of claim 10, wherein the barrier layer comprises nickel.

12. The electronic package of claim 10, wherein the barrier layer has a thickness between 500 nm and 1,000 nm.

13. The electronic package of claim 10, wherein the second electrode directly contacts the dielectric layer.

14. An electronic system, comprising:
    a board;
    an electronic package over the board, wherein the electronic package comprises an embedded capacitor, wherein the embedded capacitor comprises:
        a first electrode having a seam at a location between a top surface of the first electrode and a bottom surface of the first electrode, wherein the seam is a boundary between a hydrophilic surface of a first conductive layer of the first electrode and a hydrophilic surface of a second conductive layer of the first electrode, the seam having variations in thickness across a length of the seam from surface irregularities in the hydrophilic surface of the first conductive layer and the hydrophilic surface of the second conductive layer;
        a dielectric layer over the first electrode; and
        a second electrode over the dielectric layer; and
    a die electrically coupled to the electronic package.

15. The electronic system of claim 14, wherein the embedded capacitor is within a footprint of the die.

16. The electronic system of claim 14, wherein the embedded capacitor is embedded in a topmost layer of the electronic package.

17. The electronic system of claim 14, further comprising a plurality of dies electrically coupled to the electronic package.

18. The electronic system of claim 17, wherein the plurality of dies are electrically coupled to each other by a bridge embedded in the electronic package.

19. The electronic system of claim 18, wherein the embedded capacitor and the bridge are in the same layer of the electronic package.

\* \* \* \* \*